(12) United States Patent
Jung

(10) Patent No.: US 7,718,001 B2
(45) Date of Patent: May 18, 2010

(54) METHOD FOR FABRICATING SEMICONDUCTOR EPITAXIAL LAYERS USING METAL ISLANDS

(75) Inventor: Sung-Hoon Jung, Mokpo-Si (KR)

(73) Assignee: Galaxia Photonics Co., Ltd. (KR)

( * ) Notice: Subject to any disclaimer, the term of this patent is extended or adjusted under 35 U.S.C. 154(b) by 434 days.

(21) Appl. No.: 11/587,500

(22) PCT Filed: Apr. 20, 2005

(86) PCT No.: PCT/KR2005/001131

§ 371 (c)(1),
(2), (4) Date: Jan. 10, 2008

(87) PCT Pub. No.: WO2005/106984

PCT Pub. Date: Nov. 10, 2005

(65) Prior Publication Data

US 2009/0148976 A1    Jun. 11, 2009

(30) Foreign Application Priority Data

Apr. 26, 2000    (KR) .................. 10-2004-0028715

(51) Int. Cl.
C30B 1/00    (2006.01)
(52) U.S. Cl. .............. 117/9; 117/89; 117/103
(58) Field of Classification Search .......... None
See application file for complete search history.

(56) References Cited

U.S. PATENT DOCUMENTS

| | | | |
|---|---|---|---|
| 6,033,972 A | 3/2000 | Ro et al. | |
| 6,802,902 B2* | 10/2004 | Beaumont et al. | 117/95 |
| 7,488,385 B2* | 2/2009 | Lahreche et al. | 117/84 |
| 2002/0005566 A1 | 1/2002 | Weber et al. | |
| 2002/0056840 A1* | 5/2002 | Tsai et al. | 257/78 |
| 2004/0137732 A1* | 7/2004 | Frayssinet al. | 438/689 |
| 2009/0148976 A1* | 6/2009 | Jung | 438/46 |

FOREIGN PATENT DOCUMENTS

| | | |
|---|---|---|
| JP | 5063305 | 3/1993 |
| JP | 2002368267 | 12/2002 |

* cited by examiner

Primary Examiner—David E Graybill
(74) Attorney, Agent, or Firm—The Farrell Law Firm, LLP

(57) ABSTRACT

Disclosed is a method for fabricating a GaN semiconductor epitaxial layer. The method includes the steps of: (a) providing a substrate within a reaction furnace; (b) setting a temperature range of the substrate to be 200° C.~1,300° C.; (C) supplying a Ga metallic source on the substrate; (d) changing the supplied Ga metallic source on the substrate, to Ga metal islands; (e) supplying a nitrogenous source to the Ga metal islands after suspending supply of the Ga metallic source; (f) forming GaN islands by reacting the Ga metal islands with the nitrogenous source; and (g) growing a GaN epitaxial layer by basing the GaN islands as a seed.

9 Claims, 7 Drawing Sheets

METHOD FOR FABRICATING SEMICONDUCTOR EPITAXIAL LAYERS USING METAL ISLANDS

PRIORITY

This application claims priority to application serial number 10-2004-0028715 filed in the Korean Intellectual Property Office on 26 Apr. 2004, and to PCT/KR2005/001131 filed 20 Apr. 2005.

TECHNICAL FIELD

This invention relates to a method for growing GaN epitaxial layers having a high-quality crystalline structure and a method for fabricating a GaN light emitting diode (LED) device or a GaN laser diode (LD) device using the same.

BACKGROUND ART

GaN, which is a semiconductor material of a direct transition type having broad band gap energy of 3.4 eV, is an ideal photoelectric semiconductor material capable of realizing all the wavelengths of light ranging from the ultraviolet band to the visible light band.

There had been much difficulty in forming GaN epitaxial layers of high quality due to non-existence of a substrate, which has a lattice constant consistent with that of GaN, in the course of their growth. A resolution has now become available for fabricating a GaN device of high quality by forming a low-temperature GaN buffer layer between a substrate and a GaN device layer.

However, the GaN crystal formed by means of such method still includes much crystal defect ($1 \times 10^9$ cm$^{-2}$~$1 \times 10^{10}$ cm$^{-2}$), which becomes a bar to stable operation and lifespan of the device. In particular, such crystal defect becomes a cause of electron-hole combination, which becomes phonon dispersion without emission of light, thereby deteriorating the emitting efficiency.

To solve this problem, epitaxial lateral over-growth (ELOG) or pendeo-epitaxial growth has conventionally been used to decrease the crystal defects. However, these methods commonly pose a problem of necessitating a photolithographic process and a subsequent etching process prior to generating a GaN device layer, thereby causing contamination of the substrate and deteriorating the productivity and yield due to the separate etching process and dual growing processes.

Under the circumstances, a new method for growing GaN has become required to fabricate the GaN with a single growing process while decreasing the crystal defects.

DISCLOSURE

Technical Problem

To solve the problem in the method of using the conventional low-temperature GaN buffer layer, it is an object of the invention to provide a new method for growing a GaN crystal using Ga metal instead of the low-temperature GaN buffer layer.

It is another object of the invention to provide a method for growing epitaxial layers of GaN semiconductor of high quality using the above method, and a method for fabricating a GaN LED and LD as well as other electric devices using the same.

Technical Solution

To achieve the above objects, a method for fabricating epitaxial layers of GaN semiconductor according to the invention comprises the steps of: (a) providing a substrate within a reaction furnace; (b) setting a temperature range of the substrate to be 200° C.~1,300° C.; (c) supplying a Ga metallic source on the substrate; (d) transforming the supplied Ga metallic source on the substrate, to Ga metal islands; (e) supplying a nitrogenous source to the Ga metal islands after suspending supply of the GaN metallic source; (f) forming GaN islands by reacting the Ga metal islands with the nitrogenous source; and (g) growing a GaN epitaxial layer by basing the GaN islands as seed.

Here, the nitrogenous source may comprise at least one of ammonia or hydrazine.

The epitaxial layer grown as above may be used for forming any one of LED or LD device capable of generating light by means of electronic-hole combination.

In particular, the invention is applicable to a method for fabricating a GaN device. The method for fabricating a GaN device applicable from the invention comprises the steps of: (a) providing a substrate within a reaction furnace; (b) setting a temperature range of the substrate to be 200° C.~1,300° C.; (c) supplying a Ga metallic source on the substrate; (d) transforming the supplied Ga metallic source on the substrate, to Ga metal islands; (e) supplying a nitrogenous source to the Ga metal islands after suspending supply of the GaN metallic source; (f) forming GaN islands by reacting the Ga metal islands with the nitrogenous source; and (g) growing a u-GaN layer by basing the GaN islands as a seed; and (h) growing a GaN device layer including an n-GaN layer, a GaN active layer and a p-GaN layer onto the u-GaN layer.

Here, the GaN active layer may be constituted to control wavelength of the light generated by further including at least any one material of Al or In as a compound.

ADVANTAGEOUS EFFECTS

FIG. 2 is a view of a field emission scanning electron microscopy (FE-SEM) showing Ga islands formed on a surface of a sapphire substrate according to the invention. FIG. 3 is an electronic microscopic view illustrating the FE-SEM of a low-temperature GaN buffer layer fabricated according to the conventional art. FIG. 3 was attached so as to be compared with FIG. 2 with the same resolution.

As shown in FIG. 2, the Ga islands according to the invention are in discrete form. Also, the Ga islands are evenly dispersed over the entire area of the substrate. Such discrete dispersion of the Ga islands has also been confirmed by a component analysis using energy dispersive spectroscopy (EDS). The average half-diameter and density of the Ga islands as shown in FIG. 2 are 48.2 nm and 133/μm$^2$, respectively. Thus, the Ga islands formed in FIG. 2 are of a nano unit.

By contrast, the low-temperature GaN thin layer in FIG. 3 is a continuous thin layer. The difference in minute structures between FIG. 2 and FIG. 3 becomes a fundamental cause of creating a notable difference in the growing mechanism and the resultant crystal defects of the GaN thin layer, which is to be grown in the subsequent steps.

FIG. 4 is an electronic microscopic view of a nitride obtained by nitrifying the Ga islands formed on the surface of the sapphire substrate in FIG. 2. FIG. 5 is an optical microscopic view of a u-GaN thin layer grown on the substrate of nitrified Ga islands.

As shown in FIG. 4, the Ga islands in FIG. 2 have been evenly nitrified with regular density.

FIG. 6 is an electronic microscopic view penetrating a plane of the substrate in FIG. 5. A u-GaN thin layer has been grown on the upper portion of the Ga islands nitrified according to the invention.

FIG. 7 is an electronic microscopic view penetrating a plane of the u-GaN layer fabricated by using the conventional low-temperature GaN buffer layer. As shown in FIGS. 6 and 7, the crystal surface as grown according to the invention in FIG. 6 has less defects than the surface of the GaN thin layer in FIG. 7, which has been grown by using the conventional low-temperature GaN layer.

Such decrease in crystal defects serves to enhance internal emitting efficiency while elongating lifespan of the device. This proves superiority of the method for growing crystals according to the invention.

DESCRIPTION OF THE DRAWINGS

The above objects, features and advantages of the invention will become more apparent from the following detailed description when taken in conjunction with the accompanying drawings, in which.

BEST MODES FOR CARRYING OUT THE INVENTION

Figure 1:
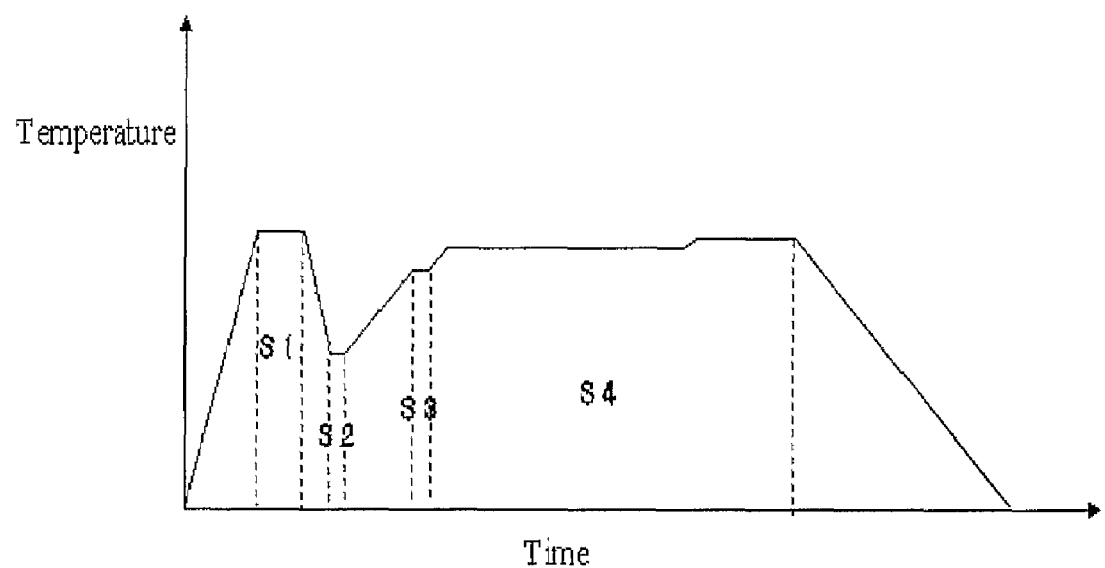
FIG. 1 is a diagram illustrating a process of the invention in accordance with time and temperature.

Best modes for carrying out the invention will now be described with reference to the accompanying drawings. In the following description, same drawing reference numerals are used for the same elements even in different drawings. The matters defined in the description are nothing but the ones provided to assist in a comprehensive understanding of the invention. Thus, it is apparent that the present invention can be carried out without those defined matters. Also, well-known functions or constructions are not described in detail since they would obscure the invention in unnecessary detail.

FIG. 1 is a graph illustrating a process of the invention in accordance with time and temperature.

Unlike the conventional method, the method for growing epitaxial layer according to the invention is not seriously dependent on interlocking with a substrate. Thus, Si or ZnO having a high degree of lattice constant inconsistency may be used as a substrate in addition to sapphire or SiC.

Such substrate is charged into a reaction furnace after undergoing a process of cleaning organic materials by means of acetone, etc. The charged substrate undergoes a pre-treatment step (S1) by being heated up to 1,300° C. under an atmosphere of hydrogen so as to eliminate residual organic materials and other impure materials adsorbed on the surface thereof.

After performing the pre-treatment step S1, the substrate is cooled down again to take a step of depositing Ga metal (S2). The temperature range for performing the step S2 is 200° C.~1,300° C., preferably 400° C.~800° C., and more preferably 550° C.~700° C. The step performed according to the best mode of the invention was to form Ga metal while supplying trimethylgallium (TMG), which is an organic metallic source of Ga, to a reaction furnace, for example, at 600° C. To prevent occurrence of an oxidizing reaction in this step, hydrogen or inactive gas such as argon or nitrogen, etc. may be supplied into the reaction furnace.

In the step S2, it is preferable to maintain the temperature at least 200° C. because TMG decomposition efficiency may be reduced under the temperature below 200° C.

The Ga metal formed in step S2 has a morphology of dome island. To control density and average diameter of such island, the temperature range may be variably set to be within 200° C.~1,300° C.

Although the best mode for carrying out the invention used TMG as a Ga metallic source, other Ga metal organic sources such as TEG, or precursors of chloride such as $GaCl_3$, may be used as a metallic source.

Ga metal islands are formed under the temperature of 600° C., which falls into the temperature range according to the best mode for carrying out the invention. Supply of the Ga metallic source is then suspended. Thereafter, the temperature range of the substrate is maintained to be about 200° C.~1,300° C. Ammonia or hydrazine gas, which is a nitrogenous source required to generate GaN within the reaction furnace under the atmosphere of hydrogen and/or nitrogen, is supplied to the reaction furnace in a step of nitrifying the Ga metal island (S3). Step S3 may be performed for about a few or several tens of minutes.

If the nitrifying step S3 is performed under the temperature lower than 200° C., the nitrified GaN islands tend to have unsound surfaces or an excessively high density. If performed at the temperature higher then 1300° C., the nitrified GaN islands tend to have an excessively low density. Hence, it is important to adopt appropriate conditions for nitrification within the presented temperature range.

Once after undergoing the nitrifying step, the deposited Ga islands become GaN islands which are finely and evenly dispersed on the substrate surface.

Thereafter, the GaN islands may become seeds, which are necessary to grow GaN epitaxial layers having a crystal of high quality, and contribute to decreasing lattice defects in the subsequent process.

If the temperature range is raised again to be about 950° C.~1,300° C., undoped GaN layers (hereinafter, referred to as "u-GaN layers") are grown, u-GaN layers of high quality can be grown with the crystal defects of about 1/10 of those fabricated by the conventional method (S4).

The thermal graphics in FIG. 1 is a schematic diagram showing temperatures in accordance with several modes performed in each step as described above. Hence, the graphic portion appearing as if the temperature is lowered or raised might not be the same in actual circumstances. For example, the temperature in the step S2 may be 1,300° C., and the temperature in the step S3 may also be 1,300° C., as described above with respect to the temperature range. In that case, the graphic portion appearing as if the temperature is raised from the step S2 to the step S3 will be linked by the same horizontal line. Therefore, the diagram in FIG. 1 is merely to assist in understanding of the invention, and the scope of claims of the invention should not be construed by solely depending on the diagram in FIG. 1.

To be described herein below is a mechanism enabling the substrate according to the invention to grow epitaxial layers with less crystal defects and higher quality than the conventional substrate using a low-temperature GaN buffer layer. The growing mechanism described herein below is nothing but an inference by the inventors that does not bind the invention.

Figure 2:
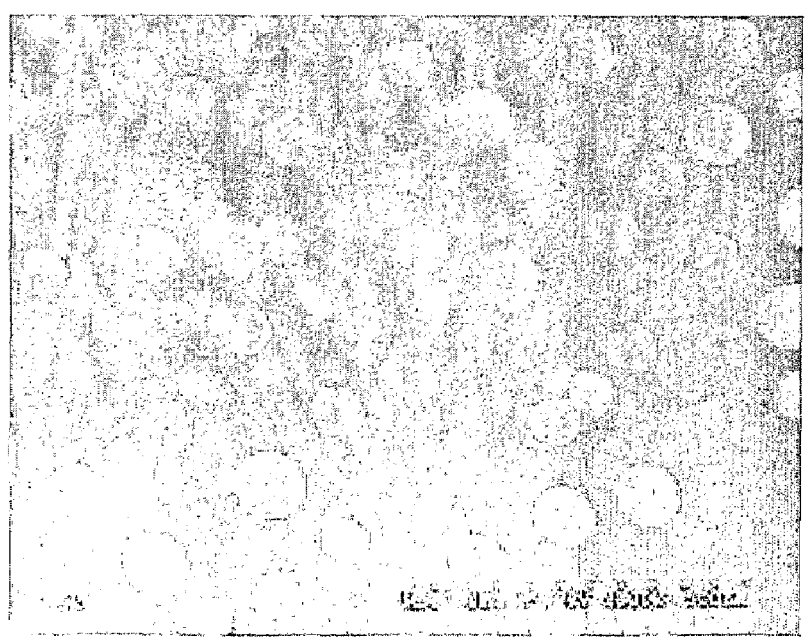
FIG. 2 is an electronic microscopic view of the surfaces of Ga islands formed in the process of depositing Ga according to a best mode of the invention.
Figure 3:
FIG. 3 is an electronic microscopic cross-sectional view of the surface of the conventional low-temperature GaN buffer layer.
Figure 4:
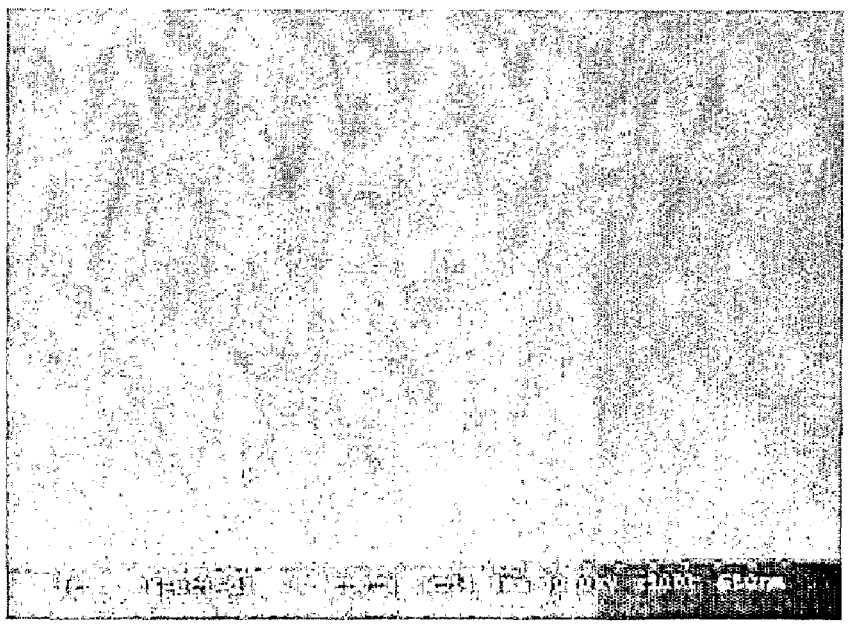
FIG. 4 is an electronic microscopic view of the surfaces of Ga islands reacted with a nitrogenous source according to a best mode of the invention.
Figure 5:
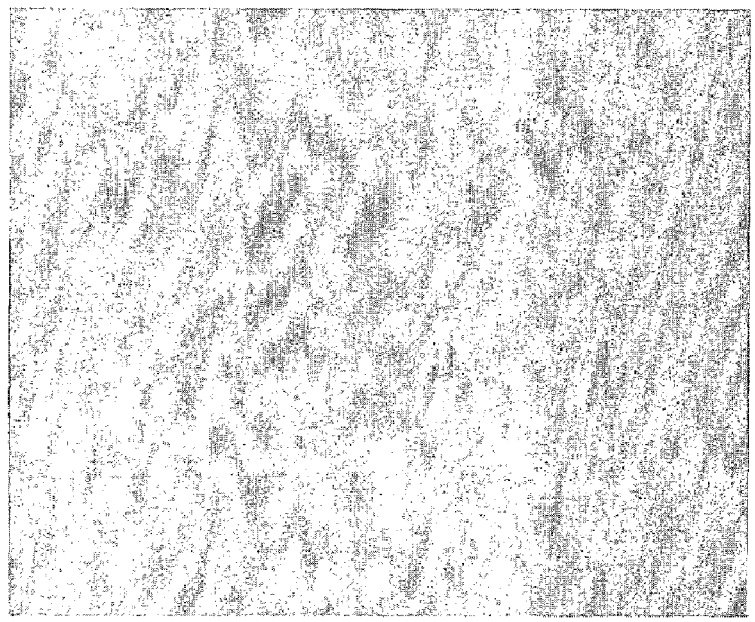
FIG. 5 is an optical microscopic view of a u-GaN thin layer formed by the islands in FIG. 4.
Figure 6:
FIG. 6 is an electronic microscopic view penetrating a plane of the substrate, on which a u-GaN thin layer has been formed by using the islands in FIG. 4.
Figure 7:
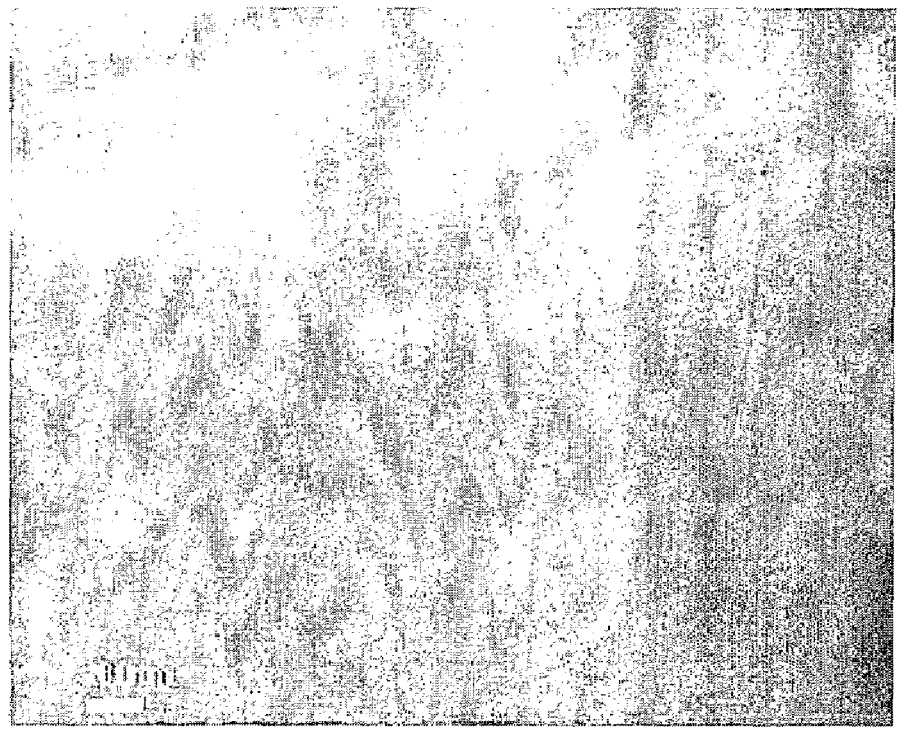
FIG. 7 is an electronic microscopic view penetrating a plane of a low-temperature GaN buffer layer grown by the conventional method.

As described with reference to the step S2 in FIG. 2, the outstanding difference of the invention from the conventional substrate using a low-temperature GaN buffer layer lies in first supplying Ga metal of group III only without supplying the nitrogenous source, and forming the same on a substrate in the form of islands rather than of a thin layer.

In the next step S3 of nitrification, the Ga metal islands are reacted with the nitrogenous source and crystallized from their surfaces. Thus, what is formed after the step S3 is not a continuous GaN thin layer like the conventional one but a cluster of discrete GaN islands of a very small size, for example, nano size.

Such GaN islands function as seeds in the subsequent step S4 of growing u-GaN, and decrease probability of generating the defects due to a lattice constant mismatch by lessening the contact area between the substrate and the u-GaN thin layers. In other words, an active lateral overgrowth occurs in step S4 from side surfaces of the GaN islands formed in step S3 so as to prevent dispersion of the defects generated from the substrate to the surfaces of GaN through formation of a potential roof. This is considered the same effect as that the conventional ELOG has been reduced to a nano size. The difference from the ELOG is that no necessity is required to separately form mask layers of SiOx, etc.

The mechanism of the invention will now be described in further detail.

Figure 8:
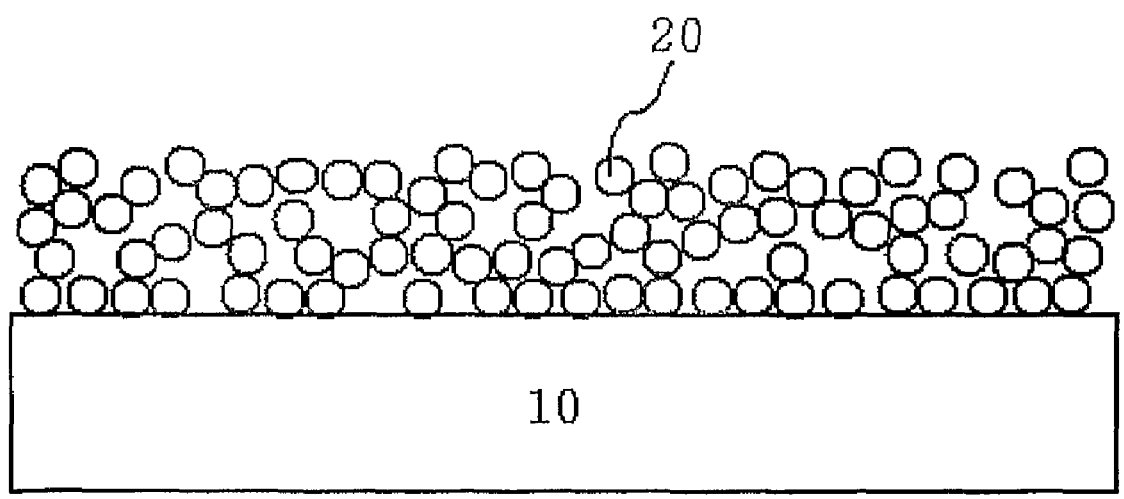
FIGS. 8 to 14 are schematic diagrams illustrating a mechanism of the invention.

FIG. 8 is a schematic diagram illustrating a surface of substrate 10 that is supposed to be resultant from the invention. After pre-treatment of the substrate 10, its temperature range is changed to be 200° C.~1,300° C. Then, Ga metallic source is supplied together with hydrogen or nitrogen to form a metallic layer. As a consequence, metallic particles, or Ga islands 20 are deposited on the surface of the substrate 10, as shown in FIG. 8, to form a metallic layer over the entire surface of the substrate 10 dispersed by pores and non-crystalline or amorphous structures.

After formation of the above metallic layer, supply of the metallic source gas is suspended, and the formed metallic layer is thermally etched. Then, the temperature range of the substrate 10 is maintained to be 200° C.~1,300° C.

Figure 9:
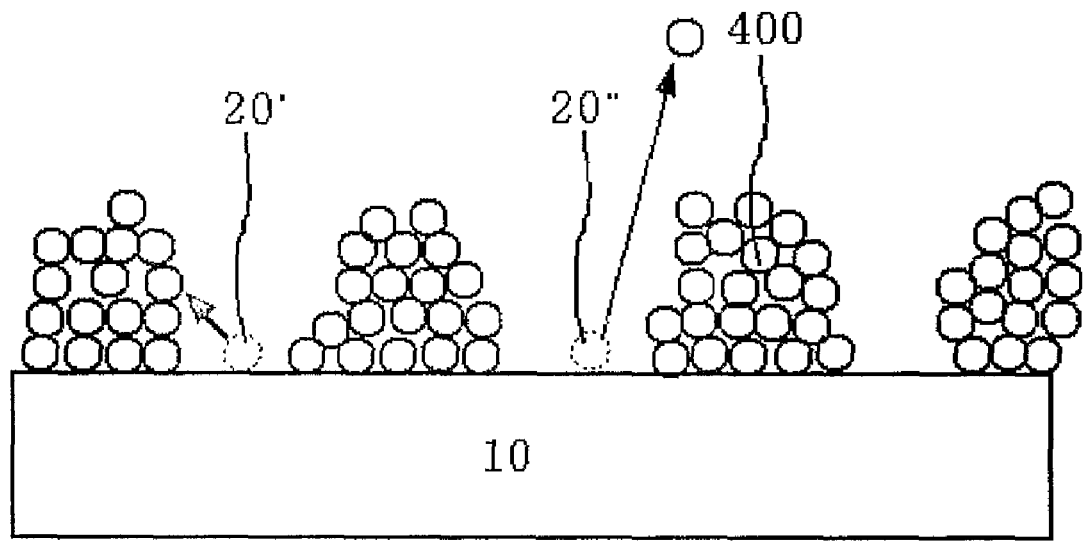

During the step of raising the temperature as shown in FIG. 9, the metallic particles that had been gathered together with a weak force on the surface are either evaporated (20") into the atmospheric gas by heat from the surface of the substrate 10 or adsorbed to the periphery of the metallic cluster 400 for thermodynamic stability so as to be re-crystallized (20'). As a result of undergoing such steps, the small metallic clusters are uniformly spaced from one another at regular intervals and dispersed onto the surface of the substrate 10. These are the Ga islands. Such uniformity is naturally formed by enthalpy and entropy on the surface of the substrate.

Figure 10:
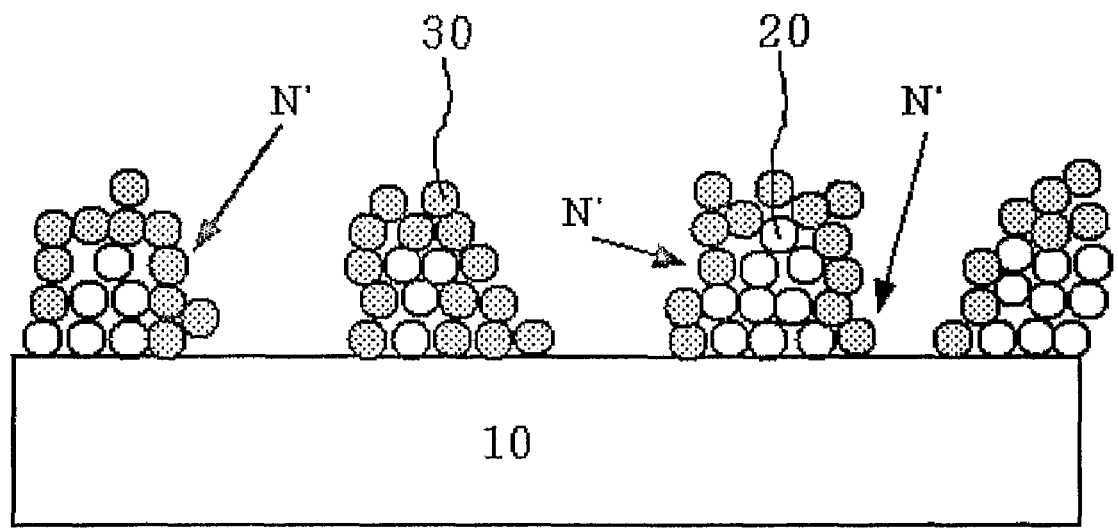

If nitrogenous source gas such as ammonia or hydrazine is supplied to the substrate of the above state, the metallic clusters are combined with active nitrogen (N*) so as to be changed into a nitride 30 or nitrified Ga islands. FIG. 10 is a schematic diagram illustrating such state, in which all the surfaces of the clusters or Ga islands are transformed to the nitride 30, in which untransformed metallic particles 20 still exist. As time elapses, these metallic particles are rapidly transformed to a nitride. Hereinafter, the transformed and dispersed nitride or nitrified Ga island will be referred to as a "seed."

Figure 11:
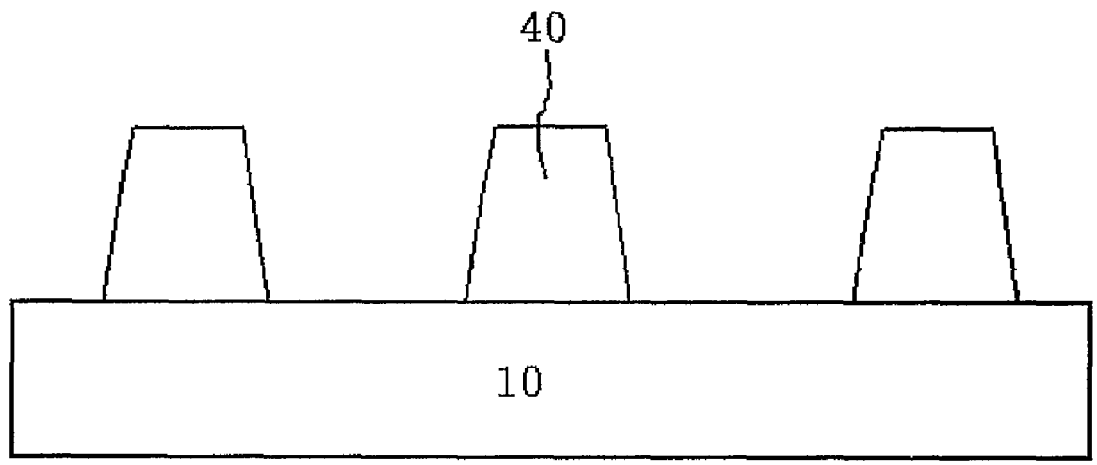

After undergoing the step of forming a nitride particle layer, the initial metallic layer is changed to a small and uniformly dispersed nitride seed. FIG. 11 is a schematic diagram illustrating how the nitride seed formed through the above process serves to form a GaN crystalline structure of a high quality.

FIG. 11 shows a uniform dispersion of a nitride seed 40 onto the surface of the substrate 10. Once the nitride seed is formed, the temperature range within the reaction furnace is changed to be about 950° C.~1,300° C. in order to form a GaN layer on a full scale. Thereafter, TMG and $NH_3$ gas are supplied to the reaction furnace to form a u-GaN layer.

Figure 12:
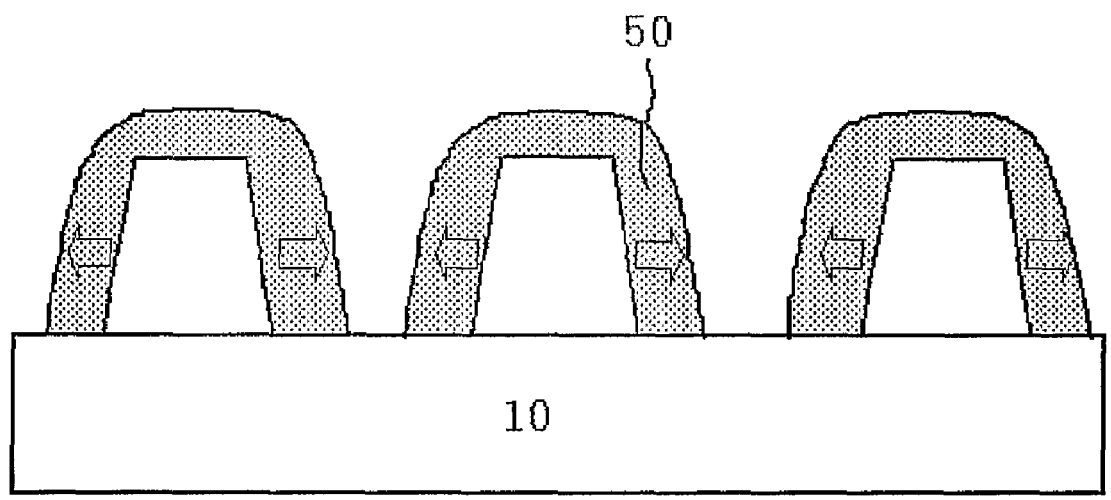

At an initial stage of supplying the gas, the u-GaN is formed around the nitride seed 40, in which the seed may act as a preferred site for growing in view of thermodynamics. The manner of the growth seems to be lateral growth. To be specific, as shown in FIG. 12, a u-GaN 50 of an initial stage is grown laterally and surrounding the nitride seed, which is a nitride of group III having an identical or similar chemical properties to itself. The crystalline structure grown at this stage is a compound of group III-V like the nitride seed. Hence, they are extremely similar to each other in terms of lattice constant and structure. Therefore, lattice strain or defects are rarely generated, particularly when the nitride seed has started from the Ga metallic islands.

Furthermore, because the lateral direction is a main direction of the u-GaN formation, the u-GaN is not seriously affected by the lattice mismatch of the substrate below, as a consequence. The lateral size of the initial u-GaN is not so large because the space or gap between the seeds is not so distant. It is therefore considered that a perfect epitaxial layer with almost no crystalline defects is grown at this stage.

Figure 13:
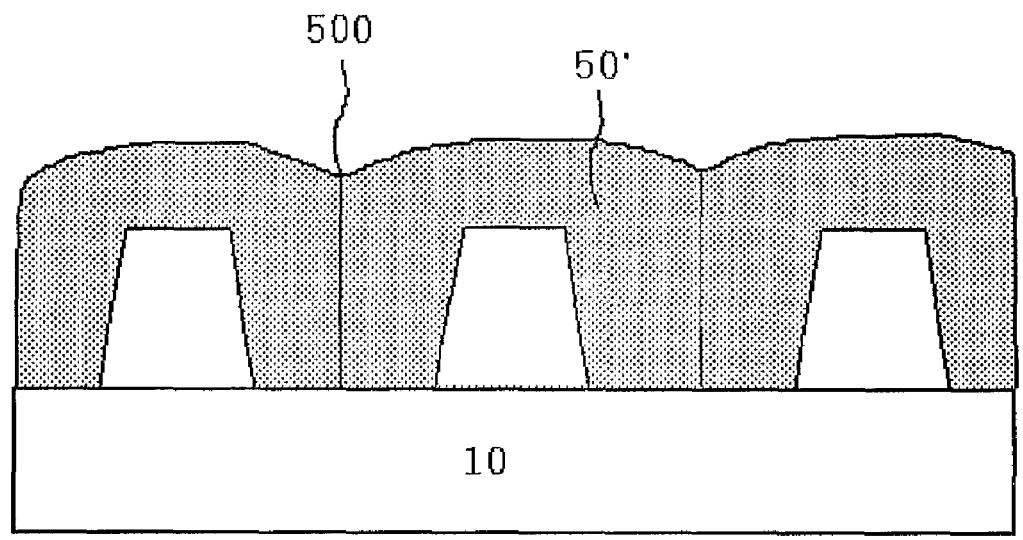

During the growing steps performed in FIG. 13, the crystalline structures of u-GaN become larger in size, and directly collide with one another to fill in the space among the nitride seeds. Such phenomenon occurs on the entire surface of the substrate, and a u-GaN layer 50' of an initial stage is formed over the entire surface of the substrate.

The u-GaN layer 50' of an initial stage has incomparably less defect density than the conventional low-temperature GaN buffer layer. Most of the defects generated on this layer are stacking faults generated on an interface 500, on which the grown layers collide with one another as described with reference to FIG. 13. However, the dominant number of defects is less than the conventional defect density, and even extinguished due to rearrangement of the potential generated at a high temperature. Accordingly, the u-GaN layer 50' of an initial stage grown according to the invention has less defects than the conventional low-temperature buffer layer while having superior surface morphology.

Figure 14:
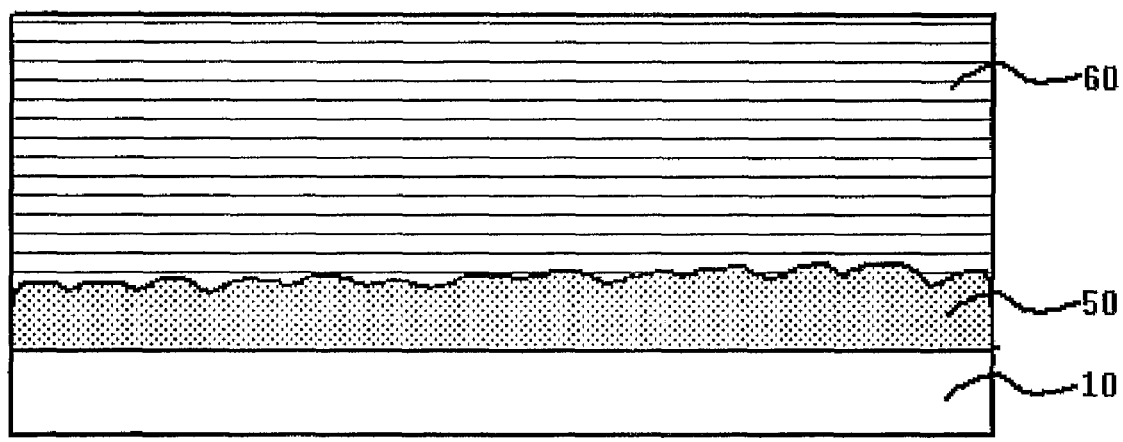

Once after the u-GaN layer 50' of an initial stage in FIG. 14 is grown, the growing time is elongated so as to grow a thick u-GaN layer 60. An n-GaN (not shown in the drawing), a GaN active layer, to which In or Al can be added, a p-GaN layer, an electrode layer, etc. are grown on the top of the thick u-GaN layer 60. If necessary, an ohmic contact layer or a window layer may be additionally grown thereon. Also, it is as described above that a pabry-perot resonator, etc. is additionally formed when fabricating a GaN LD.

The inventors assume that it is possible to obtain GaN thin layers with less crystal defects than the GaN thin layer using the conventional low-temperature GaN buffer layer through the mechanism identical or similar to the above. However, such assumption is nothing more than an assumption, and it is out of question that other mechanisms will be able to explain the effects of the invention depending on future researches.

MODES FOR CARRYING OUT THE INVENTION

Another method for fabricating a GaN device according to the invention comprises the steps of: providing a substrate; changing a temperature range of the substrate to be 200° C.~1,300° C.; depositing the a Ga metallic layer on the substrate; heightening the temperature range of the substrate, on which the Ga metallic layer has been deposited, to be 900° C.~1,300° C., while supplying gas of either $H_2$ or $N_2$; nitrifying the surface of the substrate, on which the Ga metallic layer has been deposited, by supplying nitrogenous source gas to the same; and growing a u-GaN device and a GaN device on the nitrified substrate.

Once after growing the u-GaN, a GaN LED device is fabricated by sequentially stacking a n-GaN active layer, a p-GaN layer, a contact layer and an electrode, etc. on an upper portion of the u-GaN layer. Or, a GaN laser diode may be formed by additionally forming a cavity thereon.

Detailed description of such process performed on the upper portion of the u-GaN layer will be omitted as it is identical or similar to the well-known LED or LD process. When forming an active layer of such optical devices, however, it is out of question that oscillating wavelengths may be diversified from the ultraviolet layer to the blue-green series by including Al, In, etc. in the Ga active layer according to the necessary oscillating wavelength.

INDUSTRIAL APPLICABILITY

The invention relates to a method for fabricating a GaN semiconductor epitaxial layer and a device using the same by means of Ga metal islands uniformly dispersed onto a surface of a substrate.

The method for growing GaN as well as the method for fabricating a device according to the invention serve to drastically decreasing crystal defects and produce a high-quality GaN LED or GaN LD with improved lifespan and luminance of the device in comparison with the conventional method of using a low-temperature GaN buffer layer.

While the invention has been shown and described with reference to certain modes to carry out the invention, it will be understood by those skilled in the art who have understood the technical concept of the invention that various changes in form and details may be made therein, e.g., slightly changing the temperature in each step of the process or adding the doping elements, without departing from the spirit and scope of the invention as defined by the appended claims.

The invention claimed is:

1. A method for fabricating a GaN semiconductor epitaxial layer, the method comprising the steps of:
   (a) providing a substrate within a reaction furnace;
   (b) setting a temperature range of the substrate to be 200° C.~1,300° C.;
   (c) supplying a Ga metallic source on the substrate;
   (d) changing the supplied Ga metallic source on the substrate, to Ga metal islands;
   (e) supplying a nitrogenous source to the Ga metal islands after suspending supply of the Ga metallic source;
   (f) forming GaN islands by reacting the Ga metal islands with the nitrogenous source; and
   (g) growing a GaN epitaxial layer on the GaN islands by using the GaN islands as a seed.

2. The method of claim 1, wherein the temperature range in step (b) is set to be 400° C.~800° C.

3. The method of claim 1, wherein the nitrogenous source is gas composed at least one of ammonia or hydrazine.

4. The method of claim 1, wherein the substrate comprises any one of sapphire, SiC or Si.

5. The method of claim 1, wherein the temperature range in step (f) is maintained to be 200° C.~1,300° C.

6. The method of claim 1, wherein the step (d) is performed under an atmosphere of at least one of hydrogen or nitrogen.

7. The method of claim 1, wherein the GaN epitaxial layer in the step (g) is grown at a temperature of or higher than 900° C.

8. The method of claim 1, wherein the GaN epitaxial layer grown in the step (g) constitutes any one of LED or LD, which is capable of generating light by means of an electron-hole combination.

9. A method for fabricating a GaN device, the method comprising the steps of:
   (a) providing a substrate within a reaction furnace;
   (b) setting a temperature range of the substrate to be 200° C.~1,300° C.;
   (c) supplying a Ga metallic source on the substrate;
   (d) changing the supplied Ga metallic source on the substrate, to Ga metal islands;
   (e) supplying a nitrogenous source to the Ga metal islands after suspending supply of the Ga metallic source;
   (f) forming GaN islands by reacting the Ga metal islands with the nitrogenous source;
   (g) growing a u-GaN epitaxial layer on the GaN islands by using the GaN islands as a seed; and
   (h) growing a GaN device layer including an n-GaN layer, GaN active layer and a p-GaN layer onto the u-GaN layer.

* * * * *